US010955595B2

(12) United States Patent
Van Berkel et al.

(10) Patent No.: US 10,955,595 B2
(45) Date of Patent: Mar. 23, 2021

(54) MULTILAYER REFLECTOR, METHOD OF MANUFACTURING A MULTILAYER REFLECTOR AND LITHOGRAPHIC APPARATUS

(71) Applicant: ASML Netherlands B.V., Veldhoven (NL)

(72) Inventors: Koos Van Berkel, Waalre (NL); Adrianus Hendrik Koevoets, Mierlo (NL)

(73) Assignee: ASML Netherlands B.V., Veldhoven (NL)

( * ) Notice: Subject to any disclaimer, the term of this patent is extended or adjusted under 35 U.S.C. 154(b) by 170 days.

(21) Appl. No.: 16/072,399

(22) PCT Filed: Feb. 17, 2017

(86) PCT No.: PCT/EP2017/053643
§ 371 (c)(1),
(2) Date: Jul. 24, 2018

(87) PCT Pub. No.: WO2017/153152
PCT Pub. Date: Sep. 14, 2017

(65) Prior Publication Data
US 2019/0033499 A1 Jan. 31, 2019

(30) Foreign Application Priority Data

Mar. 7, 2016 (EP) ..................................... 16158898

(51) Int. Cl.
*G02B 7/18* (2006.01)
*G02B 5/08* (2006.01)
(Continued)

(52) U.S. Cl.
CPC ......... *G02B 5/0891* (2013.01); *G02B 7/1815* (2013.01); *G03F 1/24* (2013.01); *G03F 7/70875* (2013.01); *G03F 7/70891* (2013.01)

(58) Field of Classification Search
CPC ........ G02B 5/08; G02B 5/0891; G02B 7/181; G02B 7/1815; G02B 7/185; G02B 7/192;
(Continued)

(56) References Cited

U.S. PATENT DOCUMENTS 4,431,269 A 2/1984 Barnes, Jr.
5,647,202 A * 7/1997 Althaus .................. F23R 3/005
60/266
(Continued)

FOREIGN PATENT DOCUMENTS

DE 10 2004 060184 A1 7/2006
DE 10 2009 045171 A1 10/2010
(Continued)

OTHER PUBLICATIONS

International Search Report and Written Opinion of the International Searching Authority directed to related International Patent Application No. PCT/EP2017/053643, dated May 26, 2017; 10 pages.
(Continued)

*Primary Examiner* — Thong Q Nguyen
(74) *Attorney, Agent, or Firm* — Sterne, Kessler, Goldstein & P.L.L.C. Fox

(57) ABSTRACT

A reflector for EUV radiation, the reflector comprising a reflector substrate and a reflective surface, the reflector substrate having a plurality of coolant channels formed therein, the coolant channels being substantially straight, substantially parallel to each other and substantially parallel (Continued)

to the reflective surface and configured so that coolant flows in parallel through the coolant channels and in contact with the reflector substrate.

18 Claims, 3 Drawing Sheets

(51) Int. Cl.
*G03F 1/24* (2012.01)
*G03F 7/20* (2006.01)

(58) Field of Classification Search
CPC ....... G02B 7/195; G03F 1/24; G03F 7/70875; G03F 7/70891
USPC .................................. 359/509, 512, 845, 848
See application file for complete search history.

(56) References Cited

U.S. PATENT DOCUMENTS

| | | | |
|---|---|---|---|
| 6,761,031 B2 * | 7/2004 | Bunker | F23M 5/085 60/39.37 |
| 6,897,599 B2 | 5/2005 | Sorg et al. | |
| 6,959,992 B2 | 11/2005 | Bischof | |
| 7,329,014 B2 | 2/2008 | Balogh et al. | |
| 7,591,561 B2 | 9/2009 | Phillips et al. | |
| 8,057,053 B2 * | 11/2011 | Hauf | G02B 7/1815 359/845 |
| 8,325,322 B2 | 12/2012 | Hauf et al. | |
| 8,342,701 B2 | 1/2013 | Kierey et al. | |
| 8,810,775 B2 * | 8/2014 | Kools | G03F 7/7015 355/67 |
| 2004/0009410 A1 | 1/2004 | Lercel et al. | |
| 2005/0099611 A1 | 5/2005 | Sogard | |
| 2007/0091485 A1 | 4/2007 | Phillips et al. | |
| 2008/0135211 A1 * | 6/2008 | Yassour | H01L 23/473 165/80.4 |
| 2009/0147386 A1 | 6/2009 | Sogard et al. | |
| 2010/0220302 A1 | 9/2010 | Gischa | |
| 2011/0051267 A1 | 3/2011 | Kierey et al. | |
| 2013/0176614 A1 | 7/2013 | Anderl et al. | |
| 2013/0335816 A1 | 12/2013 | Kierey et al. | |
| 2014/0016270 A1 | 1/2014 | Bonkohara | |
| 2014/0071523 A1 | 3/2014 | Hartjes et al. | |
| 2014/0247512 A1 | 9/2014 | Scheiding et al. | |
| 2015/0103426 A1 | 4/2015 | Dengel et al. | |
| 2015/0219874 A1 | 8/2015 | Figueredo | |

FOREIGN PATENT DOCUMENTS

| | | |
|---|---|---|
| DE | 10 2011 004446 A1 | 8/2012 |
| DE | 10 2012 219540 A1 | 10/2013 |
| DE | 10 2013 111801 A1 | 3/2014 |
| DE | 10 2013 214746 A1 | 8/2014 |
| DE | 102014203461 A1 | 3/2015 |
| EP | 1 376 185 A2 | 1/2004 |
| EP | 3 009 779 * | 4/2016 |

OTHER PUBLICATIONS

Howells M.R., "Some fundamentals of cooled mirrors for synchrotron radiation beam lines," Society of Photo-Optical Instrumentation Engineers, Optical Engineering, vol. 35, No. 4, 1996; pp. 1187-1197.

Bilderback D.H., "Fabricating rectangular internal cooling channels in silicon x-ray monochromator optics," American Institute of Physics, Review of Scientific Instruments, vol. 60, Jul. 1989; pp. 1977-1978.

Research Disclosure No. 594079, Sep. 23, 2013; 6 pages.

Internatinoal Preliminary Report on Patentability directed to related International Patent Application No. PCT/EP2017/053643, dated Sep. 11, 2018; 7 pages.

* cited by examiner

MULTILAYER REFLECTOR, METHOD OF MANUFACTURING A MULTILAYER REFLECTOR AND LITHOGRAPHIC APPARATUS

CROSS-REFERENCE TO RELATED APPLICATIONS

This application claims priority of EP application 16158898.3 which was filed on 7 Mar. 2016 and which is incorporated herein in its entirety by reference.

FIELD

The present invention relates to multilayer reflectors for EUV or X-ray radiation, to methods of making such multilayer reflectors and to lithographic apparatus using such multi-layer reflectors.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 5-20 nm, may be used to form smaller features on a substrate than a conventional lithographic apparatus (which may for example use electromagnetic radiation with a wavelength of 193 nm).

Collecting EUV radiation into a beam, directing it onto a patterning device (e.g. a mask) and projecting the patterned beam onto a substrate is difficult because it is not possible to make a refractive optical element for EUV radiation. Therefore these functions have to be performed using reflectors (i.e. mirrors). Even constructing a reflector for EUV radiation is difficult. The best available normal incidence reflector for EUV radiation is a multi-layer reflector (also known as a distributed Bragg reflector) which comprises a large number of layers which alternate between a relatively high refractive index layer and a relatively low refractive index layer. Each period, consisting of a high refractive index layer and a low refractive index layer, has a thickness equal to half the wavelength ($\lambda/2$) of the radiation to be reflected so that there is constructive interference between the radiation reflected at the high to low refractive index boundaries. Such a multilayer reflector still does not achieve a particularly high reflectivity and a substantial proportion of the incident radiation is absorbed by the multilayer reflector.

The absorbed radiation, including infra-red radiation also emitted by the radiation source, can cause the temperature of the multilayer reflector to rise. Known multilayer reflectors are formed on substrates made of materials having a very low coefficient of thermal expansivity, for example ULE™. However, in some cases the cross-section of the beam when incident on a reflector may be small enough that localized heating of the reflector causes undesirable deformation of the surface figure of the reflector. Such deformation can cause imaging errors and the constant desire to image ever smaller features means that the amount of deformation that can be tolerated will only reduce.

SUMMARY

It is an aim of the invention to provide an improved multilayer reflector.

According to the present invention, there is provided a reflector for EUV radiation, the reflector comprising a reflector substrate and a reflective surface, the reflector substrate having a plurality of coolant channels formed therein, the coolant channels being substantially straight, substantially parallel to each other and substantially parallel to the reflective surface and configured so that coolant flows in parallel through the coolant channels and in contact with the reflector substrate.

According to the present invention, there is provided a lithographic apparatus arranged to project a pattern from a patterning device onto a substrate, the apparatus comprising at least one reflector as described above.

According to the present invention, there is provided a method comprising projecting a patterned beam of radiation onto a substrate, wherein the patterned beam is directed or patterned using at least one reflector as described above while coolant is conducted through the coolant channels.

According to the present invention, there is provided a method of manufacturing a reflector for a projection system of a lithographic apparatus using EUV radiation, the reflector comprising a reflector substrate and a reflective surface, the substrate having a plurality of coolant channels embedded therein, the coolant channels being substantially parallel to the reflective surface, the method comprising polishing the reflective surface while a pressurised fluid is provided to the coolant channels.

BRIEF DESCRIPTION OF THE DRAWINGS

Embodiments of the invention will now be described, by way of example only, with reference to the accompanying schematic drawings, in which.

DETAILED DESCRIPTION

Figure 1:
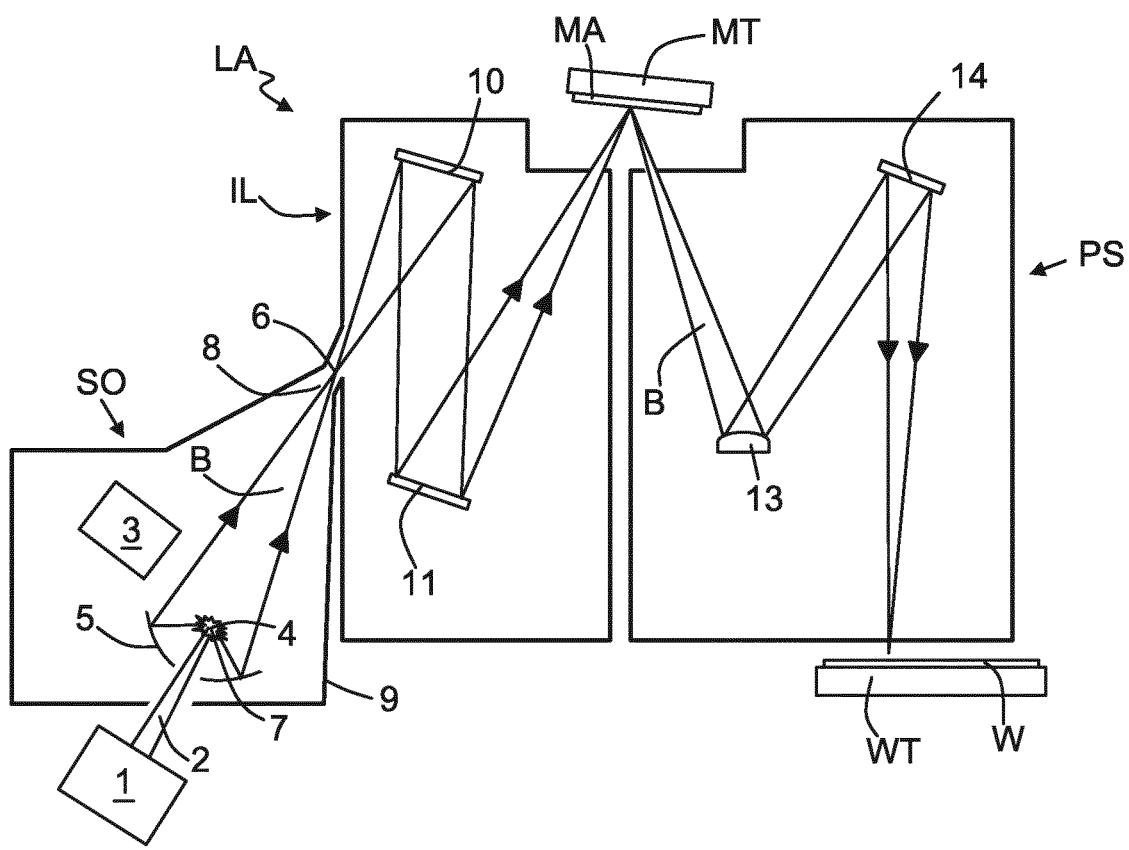
FIG. 1 depicts a lithographic system comprising a lithographic apparatus and a radiation source according to an embodiment of the invention.

FIG. 1 shows a lithographic system including a multilayer reflector according to one embodiment of the invention. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source). A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure (described further below) which is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

The laser 1 may be separate from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11. The faceted field mirror device 10, faceted pupil mirror device 11 and other reflectors of the illumination system may have a multilayer structure as described further below.

Following reflection from the patterning device MA the patterned radiation beam B enters the projection system PS. The patterning device may include a reflector having a multilayer structure as described further below. The projection system comprises a plurality of mirrors which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 1, the projection system may include any number of mirrors (e.g. six mirrors). The mirrors, and any other reflectors of the projection system PS, may have a multilayer structure as described further below.

The radiation source SO shown in FIG. 1 may include components which are not illustrated. For example, a spectral filter may be provided in the radiation source. The spectral filter may be substantially transmissive for EUV radiation but substantially blocking for other wavelengths of radiation such as infrared radiation. Alternative radiations sources, such as free electron lasers, can also be used.

Figure 2:
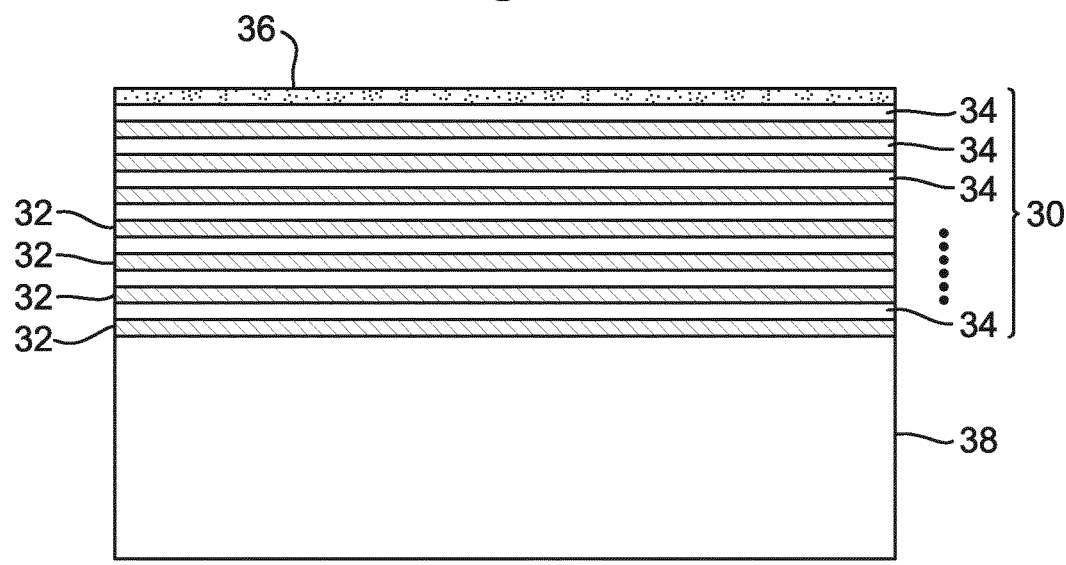
FIG. 2 depicts in cross-section a multilayer reflector.

FIG. 2 depicts a multilayer reflector 30 according to an embodiment of the present invention. The multilayer reflector 30 comprises a plurality of alternating high refractive index layers 32 (sometimes referred to as spacer layers) and low refractive index layers 34 (sometimes referred to as refracting layers). A pair of adjacent layers is referred to herein as a period. The thickness of a period is approximately equal to half the wavelength ($\lambda/2$) of the radiation that is desired to be reflected, e.g. 6.9 nm to reflect EUV radiation at 13.5 nm. There may be between 60 and 100 periods, e.g. about 80. The multilayer reflector functions as a distributed Bragg reflector with constructive interference between the radiation reflected at the boundaries between high refractive index layers and low refractive index layers. The multilayer reflector may be formed on a reflector substrate 38 and may be provided with a capping layer 36. Capping layer 36 can be formed of various known materials and helps to protect the multilayer reflector from chemical and physical damage. In an embodiment of the invention the low refractive index layers are Mo and the high refractive index layers are Si but other combinations of materials are possible.

Figure 3:
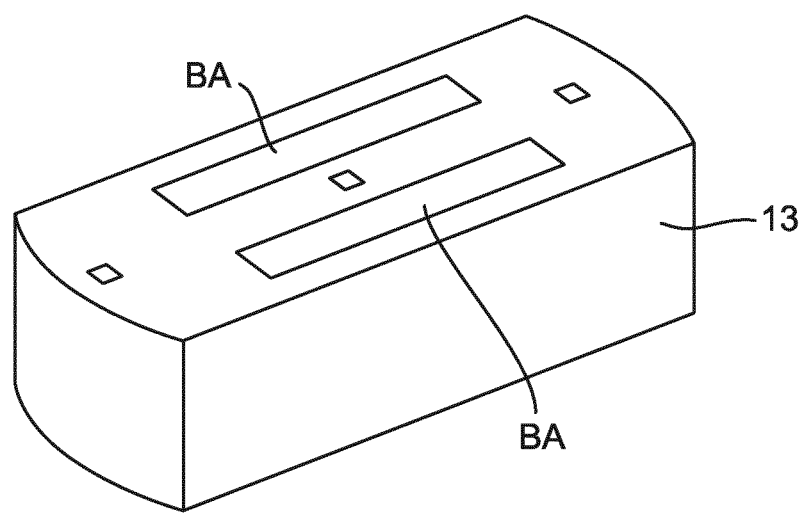
FIG. 3 depicts in perspective view a multilayer reflector illustrating the areas of incidence of a projection beam.

FIG. 3 depicts reflector 13, that is a reflector (e.g., the first) in projection system PS after the patterning device MA, in a perspective view. Reflector 13 (or, 14) may be a multilayer reflector of the type described above with reference to FIG. 2. As can be seen, the projection beam B is incident on reflector in two localized areas BA corresponding to the illuminator pupil. Reflector 13 may have a reflectivity of about 70% or less. Therefore reflector 13 absorbs a significant amount of energy from the projection beam when the lithographic apparatus is operating. The energy is absorbed by reflector 13 in the areas BA on which the projection beam is incident. Therefore the reflector experiences a non-uniform temperature rise. Although the reflector substrate 38 may be made of a material having a very low coefficient of thermal expansion, such as a titania silicate glass (specifically ULE™ manufactured by Corning Incorporated), a non-uniform temperature rise in the reflector substrate 38 can lead to a significant deformation of the surface figure of reflector 13. Even though the deformation of the surface figure of reflector 13 may be very small in absolute terms, due to the extreme precision required to manufacture devices with small feature sizes, such deformation can lead to imaging errors. The continual desire to increase throughput, by increasing beam power, will lead to an increase in the temperature rise, whilst the continual desire to image smaller features makes any deformation of the surface figure more problematic.

Existing reflectors in the projection systems of EUV lithographic apparatus are cooled passively, i.e. by radiation, conduction and convection. However none of these modes of cooling allows a high rate of heat transfer. In particular, the reflectors are generally in a high vacuum or a low pressure of Hydrogen so that heat transfer by convection is minimal Active cooling of reflectors has been avoided because of the risk of introducing vibrations in the reflector which could easily be more problematic than the distortion caused by the localized heat rise.

An embodiment of the invention is a reflector for a projection system of a lithographic apparatus using EUV radiation, the reflector comprising a reflector substrate and a reflective surface, the substrate having a plurality of coolant channels embedded therein, the coolant channels being substantially parallel to the reflective surface.

By providing a plurality of straight coolant channels parallel to each other and parallel to the reflective surface, a coolant can be circulated through the reflector substrate to control or reduce the localized temperature rise without generating problematic vibrations in the reflector. As the coolant fluid flows in parallel through the plurality of coolant channels and in direct contact with the reflector substrate, the thermal conductivity between the reflector substrate and the coolant fluid is enhanced. The heat transfer capacity of the coolant system is increased so it is possible to reduce the mass flow (kilograms per second) and average velocity (meters per second) to reduce pressure variations induced by inertia and friction, respectively. Therefore vibrations are reduced.

In an embodiment, each coolant channel has a substantially constant cross-section. By making the coolant channels with a constant cross-section, it is possible to further reduce the generation of vibrations in the reflector.

In an embodiment, each coolant channel is spaced apart from the reflective surface by a distance in the range of from 5 to 10 times the diameter of the coolant channel By providing a spacing in this range it is possible to ensure that the pressure variations of the coolant in the coolant channels does not cause a problematic deformation of the reflective surface.

In an embodiment, the distance between the centres of adjacent coolant channels is in the range of from 5 to 10 times the diameter of the coolant channels. By spacing the coolant channels in this way it is possible to ensure a desirably uniform temperature profile at the reflective surface.

In an embodiment, the coolant channels have substantially the same cross-section. By making the coolant channels have a substantially uniform cross-section, it is possible to reduce turbulence in the flow of coolant and so further reduce the generation of vibrations in the reflector.

In an embodiment, there are from 10 to 100, e.g. from 20 to 60, coolant channels. By providing this number of coolant channels it is possible to ensure a desirably uniform temperature profile at the reflective surface.

In an embodiment, the reflector substrate comprises a first reflector substrate part joined to a second reflector substrate part, the second reflector substrate part having a different composition from the first reflector substrate part. In this way it is possible to use a material with a very low coefficient of thermal expansion for the parts of the reflector substrate that have most effect on the surface figure of the reflective surface and another material having other desirable properties or lower cost for the remaining parts of the reflector substrate.

In an embodiment, the reflector substrate is formed of a titania silicate glass. A titania silicate glass can be optimised to have a low or zero coefficient of thermal expansion at a desired temperature or temperature range. In a two part reflector substrate, different grades of glass can be used for the different parts.

In an embodiment the reflector also comprises a coolant supply system connected to the coolant channels for supplying a coolant comprising water and/or carbon dioxide. Water and carbon dioxide can provide sufficient heat transfer capacity at reasonable mass flow rates.

In an embodiment, the coolant supply system is configured to supply water at a pressure in the range of from 0.001 to 10 bar, for example 2 bar. Such a pressure range can provide sufficient heat transfer capacity without causing undue vibrations and/or deformation of the surface figure.

In an embodiment the coolant supply system is configured to supply liquid carbon dioxide at a pressure in the range of from 20 bar to 100 bar, desirably 50 bar to 70 bar. Such a pressure range can provide sufficient heat transfer capacity without causing undue vibrations and/or deformation of the surface figure.

In an embodiment, the reflector is the first reflector after the patterning device. In many configurations of lithography apparatus, the first reflector after the patterning means experiences the highest heat load in use and therefore is where the invention provides the most benefit. The present invention can also provide significant advantage for other reflectors and in particular for reflectors where the effect of surface deformation on the projected image is highest.

A mask for use in a lithographic apparatus, the mask comprising at least one reflector as described above and a patterned absorber layer.

An embodiment of the invention is a method comprising projecting a patterned beam of radiation onto a substrate, wherein the patterned beam is directed or patterned using at least one reflector as described above while coolant is conducted through the coolant channels.

An embodiment of the invention is a method of manufacturing a reflector for a projection system of a lithographic apparatus using EUV radiation, the reflector comprising a reflector substrate and a reflective surface, the substrate having a plurality of coolant channels embedded therein, the coolant channels being substantially parallel to the reflective surface, the method comprising polishing the reflective surface while a pressurised fluid or gas (air is practical) is provided to the coolant channels.

By polishing the reflective surface to its final surface figure whilst the coolant channels are pressurized to their working pressure, it is possible to pre-compensate for any deformation of the surface figure due to the static component of the pressure in the coolant channels.

Figure 4:
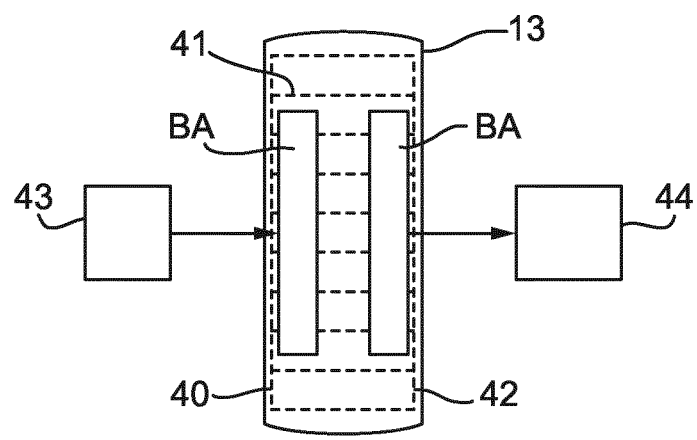
FIG. 4 depicts in plan a reflector according to an embodiment of the invention.

FIG. 4 illustrates the arrangements of coolant channels in a reflector 13 of an embodiment. A plurality of coolant channels 41 are connected to input manifold 40 and output manifold 42. The plurality of coolant channels 41 are straight, parallel to each other and parallel to the reflective surface to minimise turbulence. They are configured to form a plurality of parallel coolant circuits to maximise thermal transfer between the reflector substrate and the coolant fluid. The coolant channels are formed directly in the material of the reflector substrate so as to maximise heat transfer; there is no lining to the channels. In an embodiment, the plurality of coolant channels 41 comprises a first subset of coolant channels that are connected to a first input manifold and a first output manifold and a second subset of coolant channels that are connected to a second input manifold and a second output manifold. In such embodiment, the manifolds may be arranged in such manner that a flow of coolant through the first subset of coolant channels flows in a opposite direction as a flow of coolant through the second subset of coolant channels. In such an arrangement, the first input manifold and the second output manifold may be arranged adjacent each other on one side of the reflector 13, whereas the first output manifold and the second input manifold are arranged adjacent each other on an opposite side of the reflector 13. By arranging an opposite flow in the subsets of coolant channels, a more homogeneous temperature profile of the reflector may be obtained.

Coolant fluid is supplied from coolant supply unit 43 to input manifold 40 and removed from output manifold 42 by coolant recovery unit 44. In an embodiment input manifold 40 and output manifold 42 are omitted and the coolant channels 41 are separately connected to the coolant supply unit 43 and coolant recovery unit 44. Coolant fluid recovered by coolant recovery unit 44 can be recirculated to coolant supply unit 43. Coolant supply unit 43 can include a temperature conditioning system to ensure that the coolant fluid supplied to the input manifold 41 is at a desired temperature and pressure. The coolant supply unit and coolant recovery unit are an example of a coolant supply system. In the embodiment whereby the plurality of coolant channels 41 comprises a first subset of coolant channels that are connected to a first input manifold and a first output manifold and a second subset of coolant channels that are connected to a second input manifold and a second output manifold, the first and second input manifolds may be supplied from a common coolant supply unit, e.g. coolant supply unit 43. In such an arrangement, due to the flow in opposite directions through the first subset of coolant channels and the second subset of coolant channels, effects of pressure variations in the coolant supply may, at least partially, be cancelled out. In an embodiment, the number of coolant channels in the first subset is substantially the same as in the second subset.

Reflector 13 is the first reflector in the projection system after the patterning means. This reflector experiences the highest heat load of the reflectors of the projections system. Due to the illumination pupil the heat load is concentrated on reflector 13. Therefore reflector 13 may obtain the most benefit from in the invention. Other reflectors in the projection system may also obtain significant benefit from the invention, e.g. small reflectors, reflectors where the beam cross-section is small and/or reflectors having a high sensitivity to surface figure errors.

The coolant fluid may be water, which is advantageous as it has a high thermal capacity and so a relatively low mass flow rate can provide a large heat transfer capacity. If the coolant fluid is water, the coolant supply system may be integrated with a coolant supply system used for temperature conditioning of other parts of the lithographic apparatus, e.g. the substrate table.

The coolant fluid may be carbon dioxide. Carbon dioxide is advantageous as it can be supplied as a liquid (under pressure) so that it evaporates within the coolant channels in the regions of higher temperature. The latent heat of evaporation therefore increases the heat transfer capacity of the coolant fluid. For a given heat load, the required mass flow can be much lower than with water, therewith reducing flow-induced vibrations.

Figure 5:
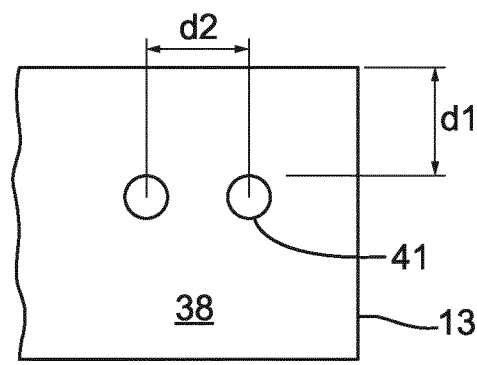
FIG. 5 depicts in cross-section a part of a reflector according to an embodiment of the invention.

As illustrated in FIG. 5, coolant channels 41 are embedded in the reflector substrate 38. Depending on the material of reflector substrate 38, coolant channels may be formed simply by creating voids of the appropriate shape and location in reflector substrate 38.

Coolant channels 41 are located a distance $d_1$ below the reflective surface (e.g. multilayer 30) of reflector 13 and are spaced apart by a distance $d_2$. Distance $d_1$ may be greater than or equal to 5 times the diameter of the coolant channels in order to prevent the pressure of coolant fluid in the coolant channels 41 causing a deformation of the reflective surface. Distance $d_1$ may be less than or equal to 30 times the diameter of the coolant channels in order to ensure a sufficient heat transfer from the reflective surface to the coolant fluid in the coolant channels. In an embodiment distance $d_1$ is equal to about 7.5 times the diameter of the coolant channels 41.

Distance $d_2$ may be in the range of from 3 to 30 times the diameter of the coolant channels 41. If distance $d_2$ is too large, the cooling of the reflective surface may not be sufficiently uniform. If distance $d_2$ is too small, the reflector substrate may be weakened or the number of coolant channels may become to large. The optimum distance between coolant channels may depend on the distance $d_1$. If the coolant channels are close to the reflective surface then a close spacing may be desirable to achieve uniform cooling.

The cross-section of the coolant channels can be any convenient shape, e.g. square or round. It is desirable that the aspect ratio of the cross-section of the coolant channels 41 not be too high, e.g. less than 4. If the cross-section of the coolant channels is not circular, the diameter of the coolant channels should be taken to be the largest dimension of the cross-section. The diameter may be greater than or equal to 0.5 mm, desirably greater than or equal to 1 mm. If the diameter is small the flow resistance may be high requiring a higher pressure difference to achieve a sufficient mass flow rate and potentially causing vibrations or deformation of the reflective surface. The diameter may be less than or equal to 5 mm, desirably less than or equal to 3 mm. If the diameter is too large, deformation of the reflective surface due to the pressure of the coolant fluid may be too large and/or it may be difficult to achieve uniform cooling. In an embodiment the diameter of the coolant channels is 2 mm.

The number of coolant channels is dependent on the size of the reflector 13 and the distance $d_2$ between coolant channels. In an embodiment, there may be between 10 and 100 coolant channels, desirably between 20 and 60. In an embodiment there are about 40 coolant channels.

Desirably the coolant channels are straight to reduce flow resistance and make manufacture easy. Desirably the coolant channels have a constant cross-section along their lengths to reduce flow resistance and make manufacture easy.

In an embodiment having 40 coolant channels which have a square cross-section of side 2 mm, a volume flow rate of water of 0.1 slm can be achieved with a pressure drop of about 20 Pa. Such a flow is found not to induce undue vibrations or pressure deformation of the surface figure. A reduction in temperature at the reflective surface of about 14° C. and a consequent reduction in temperature induced thermal deformation by a factor of 10 or more can be achieved.

In an embodiment, liquid carbon dioxide is supplied to the coolant channels 41 at a pressure in the range of from 20 bar to 100 bar, desirably from 50 bar to 70 bar. In an embodiment the pressure is 60 bar. Such a pressure allows the liquid carbon dioxide to be evaporated at a temperature within the operating range of the reflector 13 so that heat is transferred through the latent heat of evaporation of the carbon dioxide as well as the specific heat capacity thereof.

An additional advantage of the invention is that because thermal deformation of the reflector 13 is significantly reduced, a settling period when the illumination pupil (which affects the distribution of energy on the reflector 13) is changed may not be necessary. Throughput can therefore be increased.

Figure 6:
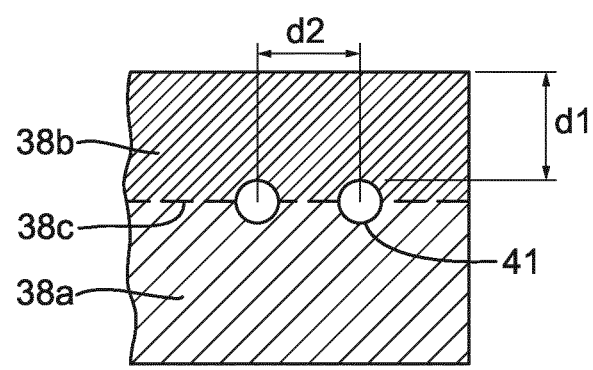
FIG. 6 depicts in cross-section a part of a reflector according to another embodiment of the invention.

FIG. 6 depicts in cross-section a part of another embodiment. In the embodiment of FIG. 6, the reflector substrate 38 is formed in two parts: lower reflector substrate part 38a and upper reflector substrate part 38b. Coolant channels 41 can be formed by removing material, e.g. by electric discharge machining, from a blank or by casting the lower reflector substrate part 38a and upper reflector substrate part 38b with appropriate recesses. The lower reflector substrate part 38a and upper reflector substrate part 38b are then joined along seam 38c. In an embodiment, the joining surfaces of lower reflector substrate part 38a and upper reflector substrate part 38b are formed sufficiently flat and clean that the lower reflector substrate part 38a and upper reflector substrate part 38b adhere together by atomic force (optical) bonding, anodic bonding atomic diffusion bonding or room temperature bonding. Alternatively an adhesive can be used.

An advantage of making the reflector substrate from two parts is that the two parts can be made of different materials. For example, the upper reflector substrate part, which defines the reflective surface, can be formed of a material with a lower coefficient of thermal expansion, or a zero coefficient of thermal expansion over a wider range, than the lower reflector substrate part. The upper reflector substrate part can be made of a higher grade of titania silicate glass, e.g. ULE™, than the lower reflector substrate part. Since the lower reflector substrate part is remote from the reflector surface it both receives a lower heat load in use and has less effect on the surface figure of the reflective surface. Therefore it can be made of a less demanding, hence less expensive material.

Titania silicate glass can be formed so as to have a zero coefficient of thermal expansion at a specific temperature. In an embodiment, lower reflector substrate part 38a and upper reflector substrate part 38b can be formed of titania silicate glasses having zero coefficient of thermal expansion at different temperatures. This is advantageous as the lower reflector substrate part 38a and upper reflector substrate part 38b will experience different heat loads and therefore reach different temperatures in use. The relative strain between the parts, however, need to remain limited to limit stresses at the bonding surface. Either or both arts of the reflector substrate can be made of Zerodur™ or cordierite.

In an embodiment, the final surface figure of the reflective surface is defined whilst a pressurised fluid (i.e. a liquid or a gas) is provided in the cooling channels. The pressurised fluid is provided at the same average pressure as the coolant fluid will be in in use. The pressurised fluid provided during formation of the final surface figure does not have to be the same fluid as the coolant fluid and does not have to be circulated. In this way, the effect of the static pressure of the coolant fluid is taken account of in the form of the final surface figure and no image distortion due to the static pressure of the coolant fluid occurs. The final surface figure may be defined by a polishing step. The polishing step may be performed on the bare surface of the reflector substrate 38 and/or after deposition of the multilayer reflector 30.

In an embodiment, the invention may form part of a mask inspection apparatus. The mask inspection apparatus may use EUV radiation to illuminate a mask and use an imaging sensor to monitor radiation reflected from the mask. Images received by the imaging sensor are used to determine whether or not defects are present in the mask. The mask inspection apparatus may include multilayer reflectors of the type described above configured to receive EUV radiation from an EUV radiation source and form it into a radiation beam to be directed at a mask. The mask inspection apparatus may further include multilayer reflectors of the type described above configured to collect EUV radiation reflected from the mask and form an image of the mask at the imaging sensor. The mask inspection apparatus may include a processor configured to analyse the image of the mask at the imaging sensor, and to determine from that analysis whether any defects are present on the mask. The processor may further be configured to determine whether a detected mask defect will cause an unacceptable defect in images projected onto a substrate when the mask is used by a lithographic apparatus.

In an embodiment, the invention may form part of a metrology apparatus. A metrology apparatus may be used to measure alignment of a projected pattern formed in resist on a substrate relative to a pattern already present on the substrate. This measurement of relative alignment may be referred to as overlay. A metrology apparatus may be used to measure critical dimension (CD) of a target. A metrology apparatus may for example be located immediately adjacent to a lithographic apparatus and may be used to measure the overlay and/or CD before the substrate (and the resist) has been processed. The metrology apparatus may use EUV radiation for increase resolution and hence may use multilayer reflectors of the type described above to form and direct an EUV radiation beam.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 5-20 nm, for example within the range of 13-14 nm. EUV radiation may have a wavelength of less than 10 nm, for example within the range of 5-10 nm such as 6.7 nm or 6.8 nm.

Although FIGS. 1 and 2 depict the radiation source SO as a laser produced plasma LPP source, any suitable source may be used to generate EUV radiation. For example, EUV emitting plasma may be produced by using an electrical discharge to convert fuel (e.g. tin) to a plasma state. A radiation source of this type may be referred to as a discharge produced plasma (DPP) source. The electrical discharge may be generated by a power supply which may form part of the radiation source or may be a separate entity that is connected via an electrical connection to the radiation source SO.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays (such as LED or OLED displays), liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A reflector for extreme ultraviolet (EUV) radiation, the reflector comprising:
    a reflector substrate and a reflective surface, wherein:
        the reflector substrate comprises a plurality of coolant channels formed therein,
        the plurality of coolant channels are substantially straight, substantially parallel to each other, and substantially parallel to the reflective surface, and are configured so that a coolant flows in parallel through the plurality of coolant channels and in contact with the reflector substrate, and
        each one of the plurality of coolant channels is spaced apart from the reflective surface by a distance in a range of about 3 to about 30 times a diameter of the respective one of the plurality of coolant channels.

2. The reflector of claim 1, wherein the each one of the plurality of coolant channels has a substantially constant cross-section.

3. The reflector of claim 1, wherein a distance between centers of two adjacent coolant channels of the plurality of channels is in a range of about 5 to about 10 times a diameter of at least one of the two adjacent coolant channels.

4. The reflector of claim 1, wherein the reflector substrate comprises a first reflector substrate part joined to a second reflector substrate part, the second reflector substrate part having a different composition from the first reflector substrate part.

5. The reflector of claim 1, wherein the reflector substrate is formed of a titania silicate glass.

6. The reflector of claim 1, further comprising:
    a coolant supply system connected to the plurality of coolant channels and configured to supply a coolant comprising water and/or liquid carbon dioxide.

7. The reflector of claim 6, wherein the coolant supply system is configured to supply the water at a pressure in a range of about 0.001 to about 10 bar.

8. The reflector of claim 6, wherein the coolant supply system is configured to supply the liquid carbon dioxide at a pressure in a range of about 20 bar to about 100 bar or about 50 bar to about 70 bar.

9. A method comprising:
    projecting a patterned beam of radiation onto a substrate, wherein the patterned beam is directed or patterned using at least one reflector of claim 1, while coolant is conducted through the plurality of coolant channels.

10. A lithographic apparatus, comprising:
    a projection system configured to project a pattern from a patterning device onto a substrate,
    wherein the projection system comprises at least one reflector comprising:
        a reflector substrate and a reflective surface, wherein:
            the reflector substrate comprises a plurality of coolant channels formed therein,
            the plurality of coolant channels are substantially straight, substantially parallel to each other, and substantially parallel to the reflective surface, and are configured so that a coolant flows in parallel through the plurality of coolant channels and in contact with the reflector substrate, and
            each one of the plurality of coolant channels is spaced apart from the reflective surface by a distance in a range of about 3 to about 30 times a diameter of the respective one of the plurality of coolant channels.

11. The lithographic apparatus of claim 10, wherein the reflector is a first reflector after the patterning device.

12. A mask for use in a lithographic apparatus, the mask comprising:
    at least one reflector comprising:
        a reflector substrate and a reflective surface, wherein:
            the reflector substrate comprises a plurality of coolant channels formed therein,
            the plurality of coolant channels are substantially straight, substantially parallel to each other, and substantially parallel to the reflective surface, and are configured so that a coolant flows in parallel through the plurality of coolant channels and in contact with the reflector substrate, and
            each one of the plurality of coolant channels is spaced apart from the reflective surface by a distance in a range of about 3 to about 30 times a diameter of the respective one of the plurality of coolant channels.

13. A method of manufacturing a reflector for a projection system of a lithographic apparatus using extreme ultraviolet (EUV) radiation, the method comprising:
    forming a reflector surface on a reflector substrate;
    embedding a plurality of coolant channels in the reflector substrate, the plurality of coolant channels being substantially parallel to the reflective surface;
    polishing the reflective surface while a pressurized fluid is provided to the plurality of coolant channels; and
    spacing each one of the plurality of coolant channels from the reflective surface by a distance in a range of about 3 to about 30 times a diameter of the respective one of the plurality of coolant channels.

14. The method of claim 13, wherein the pressurized fluid is at a pressure in a range of about 0.001 to about 10 bar.

15. A projection system comprising at least one reflector, the at least one reflector comprising:
    a reflector substrate and a reflective surface, wherein:
        the reflector substrate comprises a plurality of coolant channels formed therein,
        the plurality of coolant channels are substantially straight, substantially parallel to each other, and substantially parallel to the reflective surface, and are configured so that a coolant flows in parallel through the plurality of coolant channels and in contact with the reflector substrate, and
        each one of the plurality of coolant channels is spaced apart from the reflective surface by a distance in a range of about 3 to about 30 times a diameter of the respective one of the plurality of coolant channels.

16. A mask inspection apparatus comprising at least one reflector, the at least one reflector comprising:
    a reflector substrate and a reflective surface, wherein:

the reflector substrate comprises a plurality of coolant channels formed therein, the plurality of coolant channels are substantially straight, substantially parallel to each other, and substantially parallel to the reflective surface, and are configured so that a coolant flows in parallel through the plurality of coolant channels and in contact with the reflector substrate, and each one of the plurality of coolant channels is spaced apart from the reflective surface by a distance in a range of about 3 to about 30 times a diameter of the respective one of the plurality of coolant channels.

17. A metrology apparatus comprising at least one reflector, the at least one reflector comprising:

a reflector substrate and a reflective surface, wherein:

the reflector substrate comprises a plurality of coolant channels formed therein, the plurality of coolant channels are substantially straight, substantially parallel to each other, and substantially parallel to the reflective surface, and are configured so that a coolant flows in parallel through the plurality of coolant channels and in contact with the reflector substrate, and each one of the plurality of coolant channels is spaced apart from the reflective surface by a distance in a range of about 3 to about 30 times a diameter of the respective one of the plurality of coolant channels.

18. A method of manufacturing a reflector, the method comprising:

forming a reflector surface on a reflector substrate;

embedding a plurality of coolant channels in the reflector substrate, the plurality of coolant channels being substantially parallel to the reflective surface;

polishing the reflective surface while a pressurized fluid is provided to the plurality of coolant channels; and spacing each one of the plurality of coolant channels from the reflective surface by a distance in a range of about 3 to about 30 times a diameter of the respective one of the plurality of coolant channels.

* * * * *